United States Patent [19]

Beaucoup et al.

[11] Patent Number: 4,973,015
[45] Date of Patent: Nov. 27, 1990

[54] MANIPULATOR APPARATUS FOR TEST HEAD SUPPORT AND ORIENTATION

[75] Inventors: Louis Beaucoup; Jean Boncompain, both of Saint Etienne, France

[73] Assignee: Schlumberger Technologies, Inc., San Jose, Calif.

[21] Appl. No.: 242,779

[22] Filed: Sep. 9, 1988

[30] Foreign Application Priority Data

Sep. 17, 1987 [FR] France .................. 87 13098
Sep. 17, 1987 [FR] France .................. 87 13099

[51] Int. Cl.$^5$ .......................................... F16M 11/00
[52] U.S. Cl. .................................. 248/124; 414/590; 248/279
[58] Field of Search ............... 248/124, 279, 280.1, 248/651, 904, 162.1, 106; 414/590, 744.7; 901/48, 17, 18

[56] References Cited

U.S. PATENT DOCUMENTS

| | | | |
|---|---|---|---|
| 2,168,209 | 8/1939 | Haupt | 248/572 |
| 3,575,368 | 1/1969 | Thomas | 248/572 |
| 3,805,629 | 4/1974 | Martin et al. | 901/17 X |
| 4,132,318 | 1/1979 | Wang et al. | 414/739 X |
| 4,229,136 | 10/1980 | Panissidi | 901/48 X |
| 4,270,721 | 6/1981 | Mainor | 248/285 |
| 4,383,455 | 5/1983 | Tuda et al. | 901/48 X |
| 4,522,380 | 6/1985 | Peddle | 269/71 |
| 4,548,373 | 10/1985 | Komura | 248/280.1 |
| 4,695,024 | 9/1987 | Haven | 248/297.1 X |

FOREIGN PATENT DOCUMENTS 0102217 3/1984 European Pat. Off. .
2045068 10/1980 United Kingdom ............... 248/124

Primary Examiner—Karen J. Chotkowski
Attorney, Agent, or Firm—Skjerven, Morrill, MacPherson, Franklin & Friel

[57] ABSTRACT

A manipulator apparatus for supporting and orienting the test head (11) of an automatic test equipment. A column assembly (14) has a sheath (26) which moves vertically and which is connected via a cable to a manually adjustable counterbalancing device (41) for supporting the weight of the test head (11). A ring (54) is mounted for rotation on the sheath (26) with a side portion (63) slidably receiving an arm (64). A block (81) is mounted for rotation about a vertical axis (theta-z) at the end of arm (64). A frame (90) is mounted in block (81) to rotate about a horizontal axis (theta-x), the test head having a radially extending arm (12) mounted for rotation about an additional axis (theta-y). The a frame (90) contains a circular disk (100) which supports the test head (11), and rollers (97) to support and center the disk. The block (81) and frame (90) are adjustably attached to each other to prevent the head (11) from tilting about horizontal axis (theta-x).

8 Claims, 7 Drawing Sheets

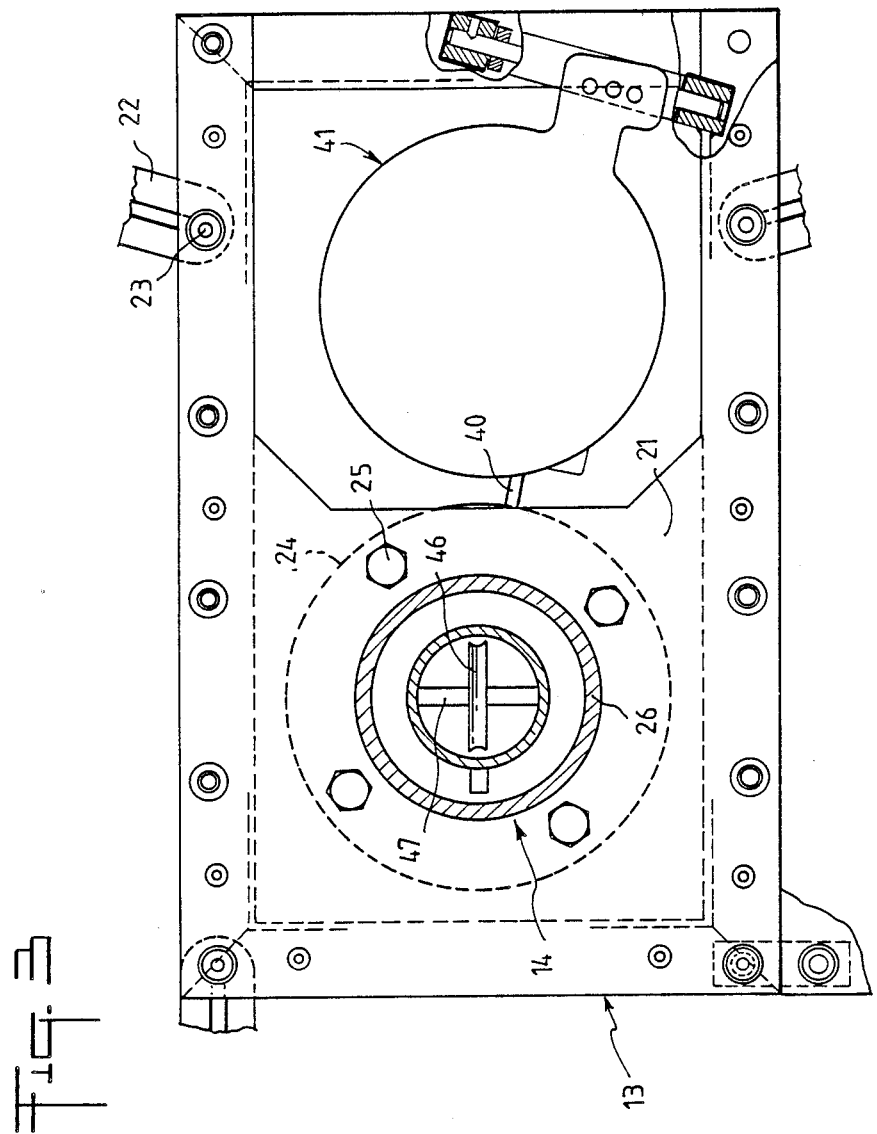

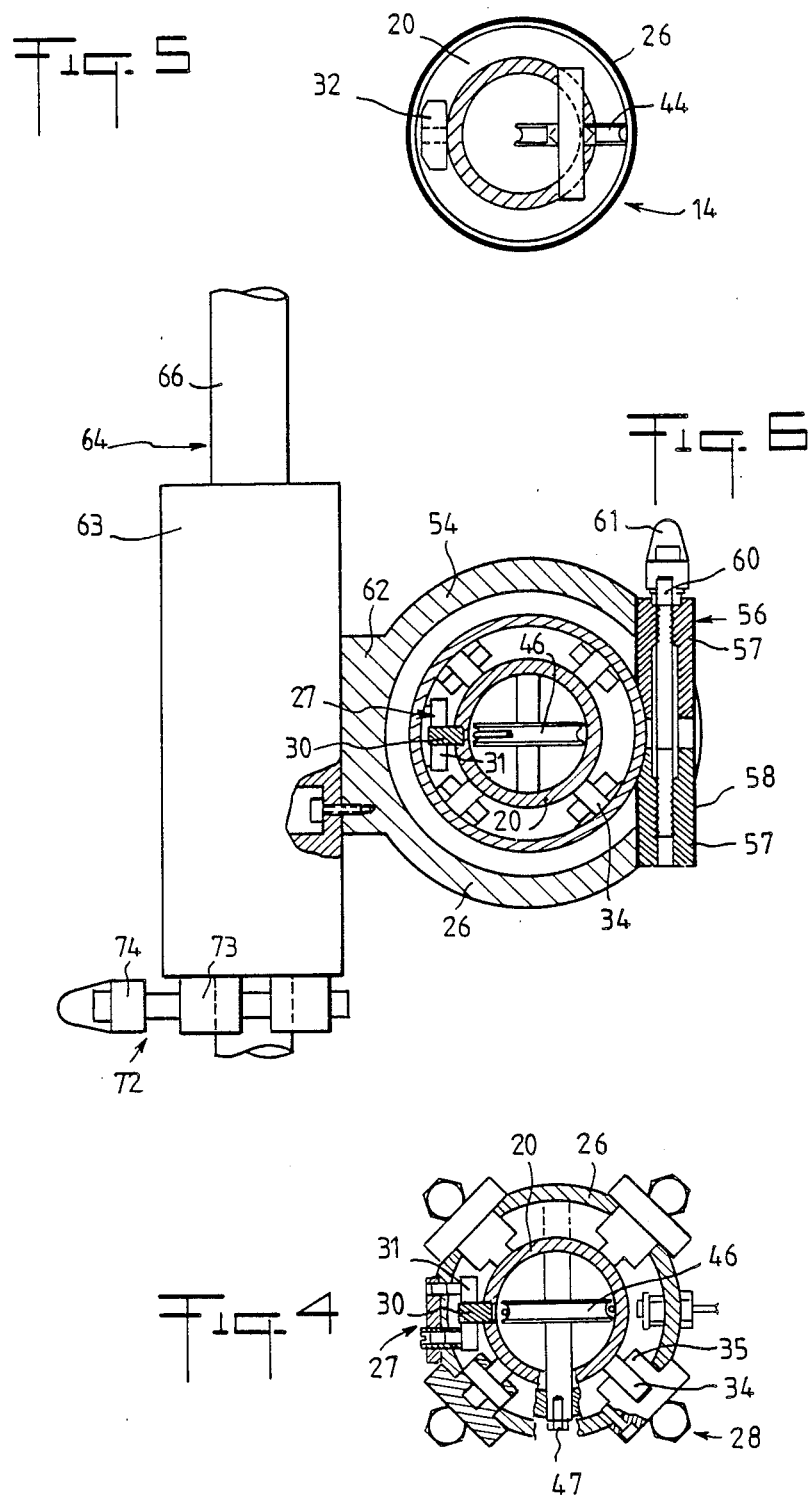

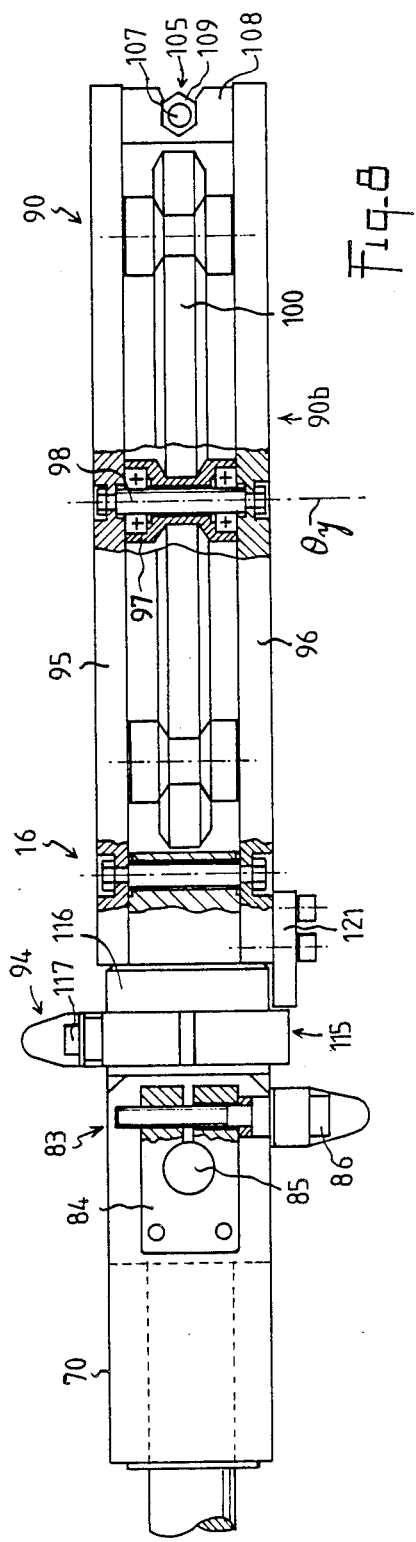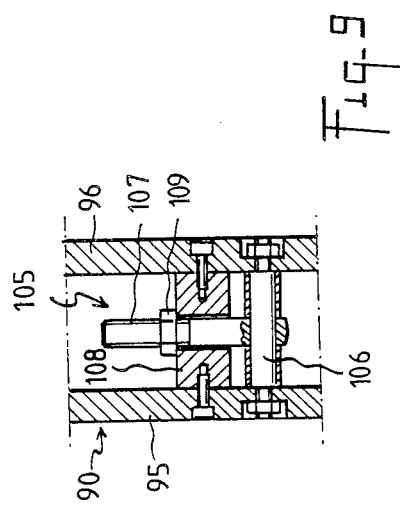

4,973,015

MANIPULATOR APPARATUS FOR TEST HEAD SUPPORT AND ORIENTATION

BACKGROUND OF THE INVENTION

1. Field of the Invention

The present invention relates to manipulator apparatus, and more particularly to manipulator apparatus for supporting and orienting the test head of an automatic test system.

2. Description of Related Art

Manipulators are intended to enable the position in elevation, azimuth, and orientation of a heavy test head to be adjusted manually so that the test head can be engaged accurately with and docked to a device handler, which is a device that feeds the test head with electronic circuits to be tested.

Electronic test heads are heavy assemblies comprising a structure supporting and protecting a large number of driver and comparator circuits which are connected to an automatic test equipment by connection cables. Each integrated circuit to be tested is successively positioned on the test head from a device handler to which the head is docked. In general, such heads are organized in the form of approximately rectangular cases which can be carried via two stub axles fixed to two opposite sides of the case in a balanced condition since the weight of the head is distributed symmetrically about these stub axles.

Other electronic test heads which will be called here asymmetrical heads have a cylindrical case with a radially extending rigid arm, containing electrical connection cables and cooling hoses.

Known manipulator apparatus, such as the one described in U.S. Pat. No. 4,527,942 (Smith), comprise a U-shaped support member or cradle which is designed to support a symmetrical test head in a balanced weight condition such that the head can be moved manually to any position in which it can be docked to a device handler.

Such manipulators are not suitable for handling asymmetrical test heads. First, stub axles disposed on opposite sides of the cylindrical case of an asymmetrical head would not support the head in a balanced condition. Secondly, a rotation of 180 degrees would not be possible with a U-shaped support engaging such stub axles due to the length of the radially extending arm which contains the connecting cables. In other words the known manipulator apparatuses are not suitable for handling asymmetrical test heads of the type described above with the required number of degrees of freedom.

An important requirement is to be able to rotate the test head by 180 degrees to have access to the lower side thereof. Another important requirement is to be able to rotate the head manually about two substantially perpendicular axes. A third important requirement is to install the test head on the manipulator or to remove it therefrom easily and without disconnecting the head from the automatic test equipment. The above requirements cannot be obtained when known manipulators are used with asymmetrical test heads.

SUMMARY OF THE INVENTION

An object of the invention is to provide a manipulator apparatus suitable for use with test heads of the asymmetrical type.

A further object of the present invention is to facilitate the installation of an asymmetrical test head on the manipulator or the removal of an asymmetrical test head while avoiding the need to disconnect the electrical cables and, where applicable, cooling hoses from the automatic test equipment.

These and other objects are obtained, according to the present invention, by a manipulator apparatus comprising a base, a vertical support structure, a test head support arm connected to the vertical support structure and having a block at the end thereof, orientating means rotatably mounted on the block about a horizontal axis, and adjustment means for maintaining the orienting means in a stable adjustable angular position about the horizontal axis. The orienting means comprises means for rotatably mounting the radially extending arm of the test head about an additional axis perpendicular to said horizontal axis.

Preferably, the orienting means comprises a frame, centering means disposed on said frame and equally spaced from the additional axis, and a disk having a peripheral portion engaging the centering means for rotation about the additional axis, the radially extending arm of the test head being fixed through the center of said disk member.

Preferably, the frame comprises a first arcuate portion which is rotatably mounted on the block about the horizontal axis and partially surrounding said disk, and a second arcuate portion pivotally connected to the first arcuate portion and moveable from a closed position in which the disk is maintained by the centering means within the frame, to an open position in which said disk is removable from the frame together with the attached test head.

BRIEF DESCRIPTION OF THE DRAWINGS

In the drawings, where like reference numerals indicate like parts:

FIGS. 3, 4, 5 and 6 plan views partially in cross section of the column assembly taken on lines III—III, IV—IV, V—V and VI—VI of FIG. 2 respectively;

FIG. 8 is a partially sectional plan view taken on line VIII—VIII of FIG. 7;

FIG. 9 is a cross-section taken on lines IX—IX of FIG. 7;

DESCRIPTION OF THE PREFERRED EMBODIMENT

Figure 1:
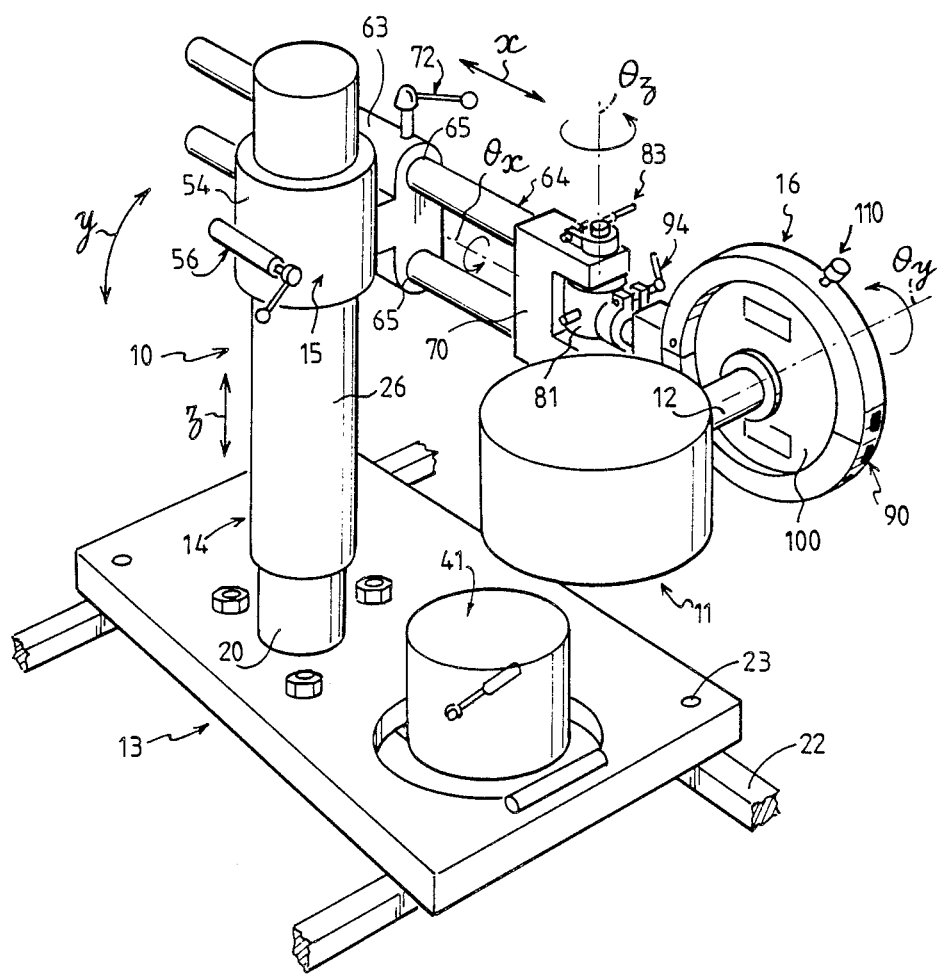
FIG. 1 is a perspective view showing a manipulator apparatus for and orienting an electronic test head.

FIG. 1 is a diagram showing a manipulator apparatus 10 for supporting and orienting an electronic test head and case 11 of the asymmetrical type and provided with a radially extending arm 12. The manipulator 10 comprises a base plate 13 having a column assembly 14 standing thereon and provided with positioning means 15 capable of displacing head orientating means 16 in the three space dimensions x, y, and z. Positioning means 15 provides three movements for the test head 11—a rotational movement (y) about column assembly 14, a linear movement along an horizontal axis (x), and a rotational movement around a vertical axis theta-z. Together with the vertical movement provided by the column assembly 14, these movements give the possibility of positioning the test head 11 among a plurality of positions located all around column assembly 14. The orientating means 16 provides two additional movements of the test head—a rotational movement about a horizontal axis theta-x, and a rotational movement about an axis theta-y.

Figure 2:
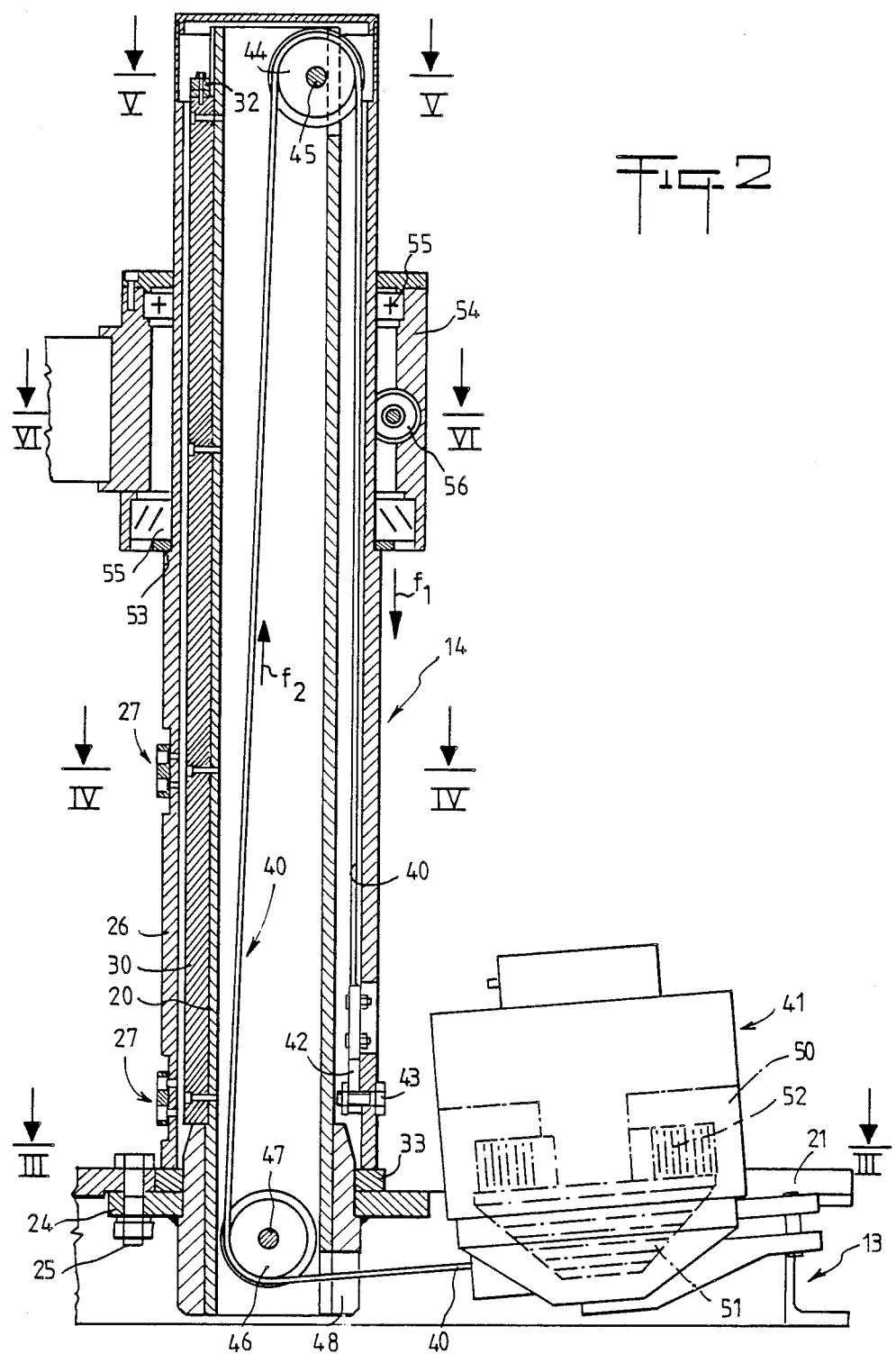
FIG. 2 is an elevational sectional view of the column assembly and of the counterbalancing system of the manipulator apparatus of FIG. 1.

The column assembly 14 comprises a first column member or vertical tubular shaft 20 fixed to the base 13. As best seen in FIGS. 2 and 3, the base 13 comprises a base plate 21 of any appropriate geometrical shape, associated with legs 22 capable of being rotated about vertical hinge axes 23. The legs 22 are shown in part only in FIGS. 1 and 3. They may be made in any appropriate manner and their length may be fixed or adjustable.

As can be seen in FIG. 2, the tubular shaft 20 is fixed by any appropriate means to the base plate 21. Preferably, the shaft 20 has a bottom flange 24 which is fixed to the base plate 21 by means of bolts 25.

The column assembly 14 further comprises a second column member or tubular sheath 26 fitted coaxially over the shaft 20 and mounted for vertical movement with respect to the shaft 20 by guide means 27 and centering means 28, which are shown in greater detail in FIG. 4.

The guide means 27 prevent the tubular sheath 26 from rotating about the tubular shaft 20. The guide means 27 comprises an axial blade 30 which is fixed to the periphery of the fixed tubular shaft 20 and at least two pairs of wheels 31 carried by the sheath 26, each pair of wheels 31 engaging the opposite side faces of the axial blade 30. The two pairs of wheels 31 are spaced apart vertically, from the bottom end of the tubular sheath 26, and co-operate with the major portion of the length of the blade 30, to prevent rotation of the sheath 26 with respect to the shaft 20 for any position of the sheath during its vertical movement. The fully extended position of the sheath 26 relative to the shaft 20 is determined by an abutment 32 (FIG. 5) fitted to the top end of the blade 30 in order to prevent further displacement of the top pair of wheels 31. The fully retracted position, as shown in FIG. 2, is determined by bringing the bottom end of the sheath 26 into abutment against the base plate 21, either directly, or else via an interposed lining 33 for supporting and shock-absorbing purposes, e.g. made of elastomer.

The centering means 28 comprises wheels 34 mounted on forks 35 carried by the sheath 26 to enable them to roll axially on the outside surface of the shaft 20. The wheels 34 are organized in two series which are spaced apart axially, by an amount corresponding to the distance between the two pairs of wheels 31, for example. Within each series, the wheels 34 are disposed at an equidistant angular spacing. FIG. 4 shows that, in preferred manner, each series comprises four wheels 34 organized in diametrically opposite pairs. There are various different ways in which the forks 35 may be made. One suitable structure comprises a flange which is fixed to the outside surface of the sheath 26, the fork 35 and the wheels 34 being mounted from the exterior through the wall of the sheath. The sheath 26 is thus guided both axially and angularly while remaining centered on the shaft 20 along which it can be displaced with minimum friction by virtue of the wheels 31 and 34. The sheath 26 may thus be placed in its retracted position corresponding to the minimum height of the column assembly 14 as shown in FIG. 2. However, the sheath 26 may also be easily raised to its fully extended position by telescopic sliding until it comes into a position fixed by abutment between the top pair of wheels 31 and the abutment 32. In order to obtain a smooth sliding the positions of at least some of the wheels 31 and 34 are adjustable by mounting their axles on adjustable centering rings.

The manipulator apparatus comprises a system for counterbalancing the weight of the positioning means and of the test head mounted thereon. The sheath 26 is connected by a flexible transmission to an adjustable force generator, viz. pulling means 41, carried by the base plate 4. The flexible transmission comprises a cable 40 having an end eyelet 42 fixed over fixing means 43 inside the sheath 26 near the bottom end thereof. The cable 40 runs up in the annular gap between the sheath 26 and the shaft 20 and then passes over a pulley 44 mounted for rotation about a horizontal axle 45 at the top of the shaft 20. Beyond the pulley 44, the cable extends axially inside the shaft 20 and passes over a bottom pulley 46 mounted for rotation about a horizontal axle 47 fixed to the base of the shaft 20. Beyond the bottom pulley 46, the cable 40 extends substantially horizontally through a slot 48 in the shaft 20 and is taken up by the pulling means 41.

The pulling means 41 applies an adjustable biasing traction force to the cable 40. The pulling means 41 comprises a housing 50 fixed to the base 13 and containing a drum 51 having a helical groove of progressively increasing spiral diameter on which the cable 40 is spooled. When the sheath 26 is fully raised, the cable 41 is wound over the whole length of the helical groove of drum 51. In the housing 50 the pulling device 41 also includes a spiral spring 52 having one end attached to the drum 51. The angular position of the other end of the spiral spring 52 can be adjusted manually with respect to the housing, by an external control lever. Depending on the weight of the test head, the pulling means 41 is adjusted, in such a manner that the traction of the spring brings the test head vertically to a desired neutral point where the force applied to cable 40 compensates the weight of the test head and the positioning means 15, this weight being applied to the cable 40 in the direction of arrows f1 and f2.

The drum 51 is designed to compensate the variations of the force applied by helical spring 52 when the cable 40 is spooled on or unspooled from this drum 51. Consequently, the force applied by the pulling means 41 is substantially constant for a limited range of vertical positions of the sheath 26 above and below the neutral point. The test head can be moved manually within this limited range of vertical positions to bring the test head to the precise desired vertical position.

At a distance from its top end, the sheath 26 includes an upwardly directed shoulder 53 on which a support ring 54 is rotatably mounted by means of two ball or roller bearings 55. The ring 54 can thus turn freely with minimum friction relative to the sheath 26 through an angle of 360 degrees. An angle locking mechanism 56 (FIG. 6) of any appropriate type is mounted in the ring 54 to lock the ring on the sheath 26. The mechanism 56 preferably comprises a cylindrical sleeve 58 fixed through the wall of the ring 54. Two nuts 57 are mounted for axial movement in the sleeve 58 and are screwed on oppositely threaded portions of a control rod 60 provided with a rotary control knob 61. The sleeve 58 has an opening in the middle part thereof so that a portion of sheath 26 project into the sleeve 58 to enable the nuts 57 to engage the sheath 26 when they are urged axially towards each other inside the sleeve 58 by appropriate rotation of the rod 60. The mechanism 56 can be used to lock the ring 54 very accurately in any angular position around the sheath 26.

The ring 54 comprises a laterally extending portion 62 which is preferably diametrically opposite to the locking mechanism 56 and which carries a body 63 for guiding a horizontal arm 64 supporting the electronic test head. The guide body 63 defines at least one horizontal and preferably two horizontal slideways 65 disposed parallel and one above the other offset from the axis of the column assembly. The slideways 65 support and guide two sliding bars 66 forming the arm 64. At one of their ends, the sliding bars 66 are interconnected by a U-shaped support body 70 on which the orientating means 16 is hinged for supporting the electronic test head. The guide body 63 is provided with at least one mechanism 72 (FIG. 6) for axially locking the arm 64. The mechanism 72 may be constituted by a split flange 73 associated with a screw type clamping member 74 and having at least one of the sliding bars 66 passing therethrough. When the screw 74 is tightened, the split flange 73 is closed, thereby clamping the sliding bar 66 and locking it axially relative to the body 63.

The above-described column assembly 14 has a relatively small vertical extended length due to the fact that the assembly comprises a fixed tubular shaft 20 and a sheath 26 telescopically mounted thereon. The vertical movement of the sheath 26 enables the support ring 54 to be placed anywhere between a lower position as shown in FIG. 2 via any intermediate position up to an upper position where the sheath 26 is extended relative to the shaft 20 to come into contact with the abutment 32.

The ring 54 enables the arm 64 to be pointed in any angular position over a range of 360 degrees around the vertical axis of the column assembly 14.

The lateral arrangement of the guide body 63 offset from the vertical axis of rotation of the ring 54 results in easy displacements of the arm 64 thereby facilitating the handling of the test head.

The use of a cantilevered arm 64 which is preferably constituted by two sliding bars situated in a common vertical plane gives a relatively short and rigid configuration, able to handle heavy heads with very low efforts from the operator.

The relatively compact pulling device 41 which can apply an adjustable compensated traction force to support the weight of the test head allows the user to perform adjustments easily and continuously as a function of the weight of the test head without requiring handling cumbersome and heavy counter weights.

Figure 7:
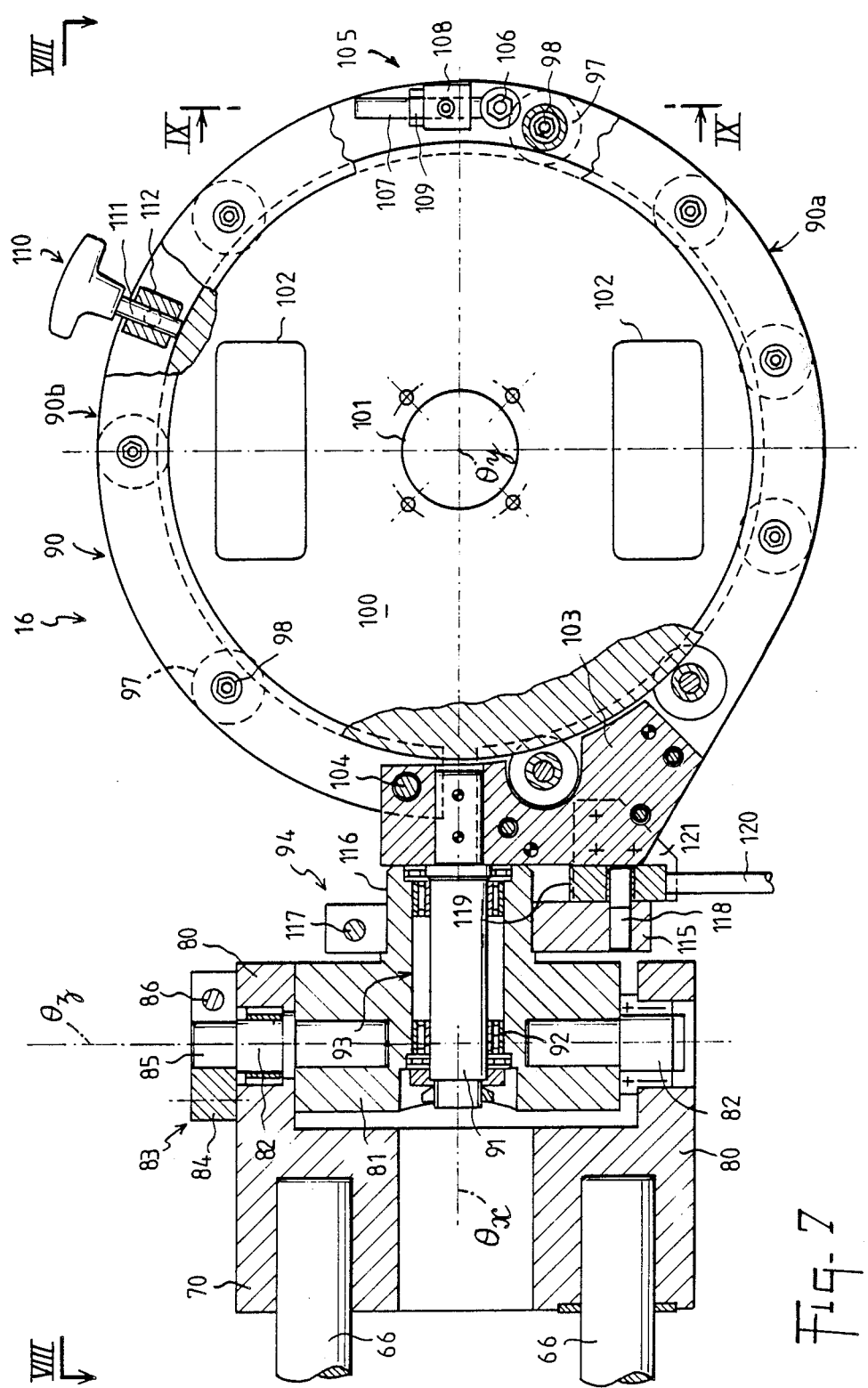
FIG. 7 is a partially sectional elevation view of the orientating device of the manipulator apparatus.

Referring to FIGS. 7 and 8, the U-shaped support body 70 which is attached to the sliding bars 66 comprises upper and lower tines 80 having each a cylindrical opening for rotatably receiving a block 81. The block 81 comprises two stub axles 82 which are rotatably mounted by means of ball or needle bearings in the openings of tines 80 to define a vertical axis of rotation theta-z, generally parallel to the axis of the column assembly 14. Rotation between the support body 70 and the block 81 may be locked by means of angular locking means 83 which are manually controlled. The locking means 83 may, for example, comprise a split flange 84 fixed on the upper tine 80 of the body 70 in order to surround an extension 85 of the top stub axle 82. The flange 84 is associated with a clamping member 86 capable of opening or closing the flange in order to angularly release or to angularly lock the extension 85 of the stub axle 82 which is fixed to or part of the block 81.

The orientating means 16 comprises an annular frame 90 which is provided on its outside with a cylindrical tail 91 extending radially and rotatably mounted via ball bearings 92 in a bore 93 in the block 81 about an axis of rotation theta-x extending substantially horizontally and intersecting the axis theta-z. The block 81 carries means 94 which will be described hereafter, for adjusting and maintaining the angular position of the annular frame 90 about the axis theta-x.

The annular frame 90 comprises two parallel rings 95 and 96 (FIG. 8) containing centering means 97 therebetween, which are constituted by rollers mounted to rotate freely on spacers 98. The centering means 97 are provided to support and center a circular disk 100 for rotation about an axis theta-y, which is the geometrical axis of the annular frame 90. The rollers 97 are preferably in the form of waisted (or necked) cylinders which fit over the complementary peripheral edge of the disk 100. For example, the disk 100 which is intended for supporting the electronic test head 11 includes means 101 in its center for receiving and fixing the radially extending arm 12 of the test head, together with windows 102 for passing and/or containing electrical connectors coming from the test head 11.

In order to facilitate assembling and/or interchanging the disk 100, the annular frame 90 preferably comprises a first arcuate portion 90a which extends from a fork 103 fixed to the tail 91. The fork 103 is provided with a pivot axis 104 disposed parallel to the axis of rotation theta-y. The axis 104 supports a second arcuate portion 90b pivotally mounted in the plane of FIG. 7 between an open position relative to the arcuate portion 90a in which it leaves an open space which is sufficient to take off disk 100 from the annular frame 90, and a closed position in which it builds up a complete circle in conjunction with arcuate portion 90a. The arcuate portion 90a and 90b are connected together by connecting means 105 (see also FIG. 9), which comprises, for example, a pin 106 rotatably mounted between the two half rings constituting the arcuate portion 90a, a radial threaded rod 107 which extends from pin 106 for engaging a fork 108 attached to arcuate portion 90b and a clamping nut 109 threaded on rod 107 for pressing arcuate portion 90b against arcuate portion 90a.

Each of the arcuate portions 90a and 90b is constituted by two interassembled half-rings, as mentioned above, to form annular frame 90 when the arcuate portions are locked to each other by the connecting means 105.

The annular frame 90 is provided with locking means 110 for locking the angular position of the disk 100 about its axis of rotation theta-y The locking means 110 may comprise, for example, a pressure screw 111 passing through a fixed nut 112 carried by the ring 90 so as to bear in a radial direction against the peripheral edge of the disk 100. Naturally, other technical means could be used for providing the same function.

As mentioned before, the apparatus comprises adjustment means 94 to adjust and maintain the angular position of the annular frame 90 about the axis theta-x in the block 81. The adjustment means 94 comprise a split flange 115, which is fixedly mounted on a cylindrical bearing surface 116 formed on the block 81 concentrically about the axis theta-x of the bore 93. The split flange 115 is locked on the bearing surface 116 by means of a screw 117 passing through the two branches of said flange on either side of the gap therein.

At the opposite end to the screw 117, the flange 115 carries a shaft 118 on which an eccentric camming member 119 is mounted free to rotate. The eccentric member 119 is extended by an operating handle 120 and has a peripheral camming surface engaging a plate 121 fixed to the fork 103 of annular frame 90.

Figure 10:
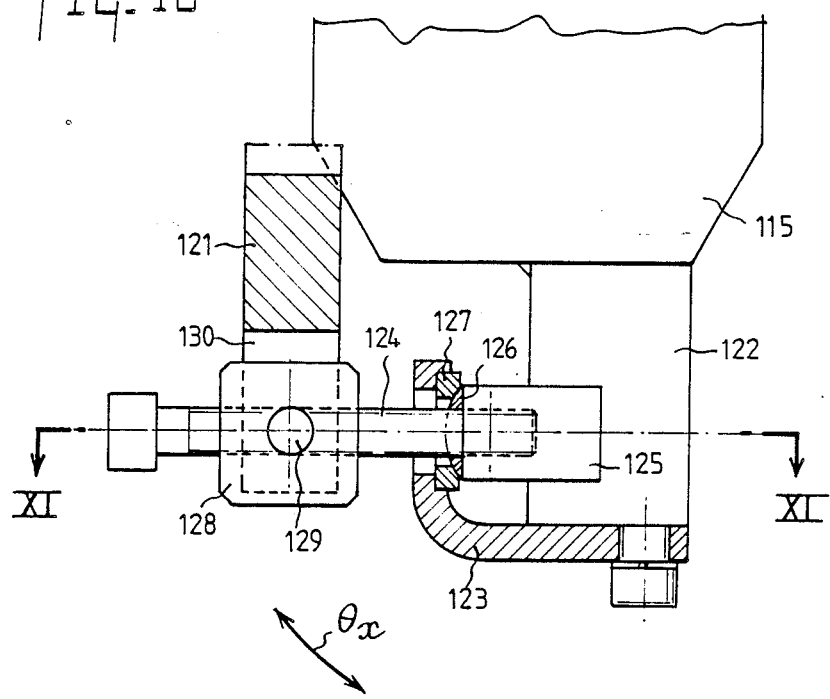
FIG. 10 is a partial elevation section on a larger scale showing a embodiment of adjustment means of the manipulator apparatus.
Figure 11:
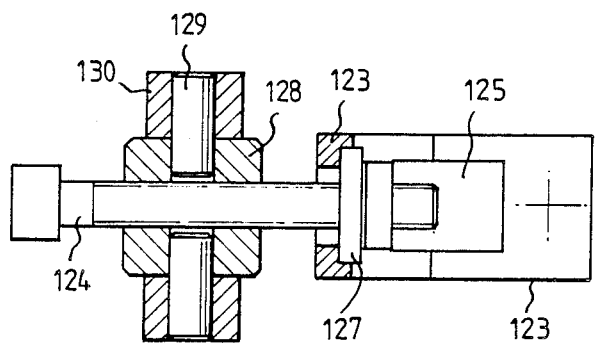
FIG. 11 is a sectional view taken on line XI—XI of FIG. 10.

In a second embodiment of the adjustment means shown in FIGS. 10 and 11, the flange 115 includes a downwardly extending portion 122 carrying a L-shaped abutment strip 123 having an opening through which a screw 124 passes freely. One end of the screw 124 is fixed to a nut 125 having an internal cap 126 with a spherical bearing surface received in a complementary seat 127 bearing on the abutment strip 123. Ahead of the abutment strip 123 the screw 124 is threaded in a nut 128 pivotally mounted by stub axles 129 running parallel to the axis theta-x of the bore 93 on a fork 130 fixed to the plate 121 or to another part carried by the fork 130.

With any of these embodiments, the user can proceed with angular adjustment of the position of the annular frame 90 around axis theta-x with the test head attached while preventing said annular frame 90 from tilting about said horizontal axis theta-x under effect of the unbalanced weight of the test head. This adjustment is limited to a given range of positions of the annular frame 90 about axis theta-x. In the embodiments described the adjustment means 94 were designed to provide a rotation of axis theta-y around axis theta-x from −5 degrees to +5 degrees from a horizontal position of axis theta-y.

As can be seen from the foregoing description, the apparatus includes orientating means 16 which is particularly suitable for supporting an asymmetrical type electronic test head including a radially extending arm which is received by the disk 100. Such a head (as can easily be seen in FIG. 1) can thus easily be fixed in a cantilevered position so that its radial arm 12 is in alignment with the axis of rotation theta-y about which the head 11 can be oriented by at least 180 degrees in a manner which is simple and easy by rotating the disk 100. The disk 100 can be locked angularly using the locking means 110.

The head 11 can also be adjusted and oriented about the axis of rotation theta-x for a limited amount of movement by rotating the frame 90 about said axis, i.e. about the tail 91 by the adjustment means 94.

The manipulator apparatus in accordance with the invention thus makes it possible, in a manner which is practical, quick, and effective, to support an asymmetrical type head having a radially extending arm in a cantilever arrangement while ensuring that said head can be moved manually with the required degrees of freedom.

It will be noted here that except the adjustment means 94, all the locking mechanisms 56, 72, 83 and 110 can be released to position the head 11 manually and dock it with a device handler. The locking mechanisms can also be released after docking the head to the device handler. The head then remains in position without being subjected to stresses from the manipulator.

The invention is not limited to the examples described and shown, and numerous modifications may be applied without going beyond the scope of the invention.

What is claimed is:

1. A manipulator apparatus for supporting and orienting a test head, comprising:
   a base;
   a vertical support structure mounted on said base;
   a first support arm connected to said vertical support structure, said first support arm having a block at the end thereof;
   a test head case having a case support arm extending therefrom and adapted to receive said test head;
   orientating means rotatably mounted on said block about a first axis and comprising:
     a frame rotatably mounted on said block about said first axis;
     centering means disposed on said frame and equally spaced from a second axis transverse to said first axis; and
     a disk having a peripheral portion engaging said centering means for rotation about said second axis, said case support arm being fixed to said disk at the center thereof; and
   adjustment means for maintaining said orientating means in a stable adjustable angular position about said first axis relative to said block.

2. The apparatus of claim 1 wherein said frame comprises:
   a first arcuate portion rotatably mounted on said block about said first axis and partially surrounding said disk; and
   a second arcuate portion pivotally connected to said first arcuate portion and moveable from a closed position in which said disk is maintained by said centering means within said frame, to an open position in which said disk is removable from said frame together with the attached test head.

3. The apparatus of claim 2 wherein said centering means comprises spaced apart rollers rotatably mounted on said frame.

4. The apparatus of claim 1 further comprising a manually operable locking member movably mounted on said frame between a locked position in which said locking member engages said disk for preventing rotation thereof about said second axis, and an unlocked position in which said disk is free to rotate about said second axis.

5. An apparatus as in claim 1, wherein said first axis is a horizontal axis.

6. An apparatus as in claim 1, wherein said second axis is perpendicular to said first axis.

7. A manipulator apparatus for supporting and orienting a test had, comprising;
   a base;
   a vertical support structure mounted on said base;
   a first support arm connected to said vertical support structure, said first support arm having a block at the end threreof;
   a test head case having a support arm extending therefrom and adapted to receive said test head;
   orientating means rotatably mounted on said block about a first axis and comprising means for rotatably mounting said case support arm about a second axis perpendicular to said first axis; and
   an adjustable screw linking said block and said orientating means such that manual rotation of said screw rotates said orientating means about said first axis with respect to said block over a limited range of angular positions about said first axis.

8. A manipulator apparatus for supporting and orienting a test head, comprising;
- a base;
- a vertical support structure mounted on said base;
- a first support arm connected to said vertical support structure, said first support arm having a block at the end thereof;
- a test head case having a case support arm extending therefrom and adapted to receive said test head;
- orientating means rotatably mounted on said block about a first axis and comprising means for rotatably mounting said case support arm about a second axis perpendicular to said first axis; and
- a camming member rotatably mounted on one of said block and orientating means and engaging an other of said block and orientating means such that rotation of said camming member rotates said orientating means about said first axis with respect to said block over a limited range of angular positions about said first axis.

* * * * *